(12) United States Patent
Ando

(10) Patent No.: US 12,744,360 B2
(45) Date of Patent: Sep. 22, 2026

(54) LASER DIODE DRIVER CIRCUIT

(71) Applicant: Murata Manufacturing Co., Ltd., Nagaokakyo (JP)

(72) Inventor: Shota Ando, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 927 days.

(21) Appl. No.: 17/875,962

(22) Filed: Jul. 28, 2022

(65) Prior Publication Data

US 2022/0376472 A1 Nov. 24, 2022

Related U.S. Application Data

(63) Continuation of application No. PCT/JP2020/045892, filed on Dec. 9, 2020.

(30) Foreign Application Priority Data

Apr. 15, 2020 (JP) ................................ 2020-072989

(51) Int. Cl.
*H01S 5/042* (2006.01)
*H01S 5/026* (2006.01)

(52) U.S. Cl.
CPC .......... *H01S 5/0428* (2013.01); *H01S 5/0261* (2013.01)

(58) Field of Classification Search
None
See application file for complete search history.

(56) References Cited

U.S. PATENT DOCUMENTS 9,300,113 B2 * 3/2016 Hoffman ............... H01S 5/0428
11,715,930 B2 * 8/2023 Yu .......................... G01S 17/10 372/38.02
12,092,768 B2 * 9/2024 Huang .................. H01S 5/0428
12,189,062 B2 * 1/2025 Fancsali .................. G01S 7/484
12,267,015 B2 * 4/2025 Russell ................. H02M 3/158
12,413,045 B2 * 9/2025 Zamprogno ......... H03K 17/102
2004/0202215 A1 * 10/2004 Fairgrieve ............. G11B 7/126
2007/0280314 A1 12/2007 Keh et al.
2009/0279069 A1 11/2009 Jensen et al.
2018/0261975 A1 * 9/2018 Pavlov .................. G01S 7/4816
2018/0267152 A1 9/2018 McMichael et al.
2019/0227170 A1 * 7/2019 Niimura .................. G01S 17/10
2020/0203923 A1 * 6/2020 Yu .......................... G01S 17/89
(Continued)

FOREIGN PATENT DOCUMENTS

CN 204885822 U 12/2015
JP H08-330655 A 12/1996
(Continued)

OTHER PUBLICATIONS

International Search Report in PCT/JP2020/045892, mailed Mar. 9, 2021, 4 pages.

*Primary Examiner* — Tod T Van Roy
(74) *Attorney, Agent, or Firm* — ArentFox Schiff LLP

(57) ABSTRACT

A laser diode driver circuit is provided that has a loop including a laser diode, a drive capacitor for storing drive charge, and a switch element, a first inductor coupled in series with the laser diode, a parallel capacitor coupled in parallel with a series circuit composed of the laser diode and the first inductor, and a first diode coupled in parallel with the series circuit in opposite polarity to the laser diode.

8 Claims, 6 Drawing Sheets

(56) References Cited

U.S. PATENT DOCUMENTS

| | | | | |
|---|---|---|---|---|
| 2021/0028158 | A1* | 1/2021 | Takimoto | H01L 25/167 |
| 2022/0376470 | A1* | 11/2022 | Nakakohara | G01S 7/4814 |
| 2022/0376472 | A1* | 11/2022 | Ando | G01S 7/484 |

FOREIGN PATENT DOCUMENTS

| | | | |
|---|---|---|---|
| JP | 2005-302895 | A | 10/2005 |
| JP | 2009544022 | A | 12/2009 |
| JP | 2012-033541 | A | 2/2012 |
| JP | 2016152336 | A | 8/2016 |
| JP | 201728235 | A | 2/2017 |
| JP | 2020506399 | A | 2/2020 |
| WO | 2018066612 | A1 | 4/2018 |
| WO | 2019207938 | A1 | 10/2019 |

* cited by examiner

106A
LP2
V1
LD1
C2
L1
Q1
LP1
LP3

PRIOR ART

PRIOR ART

LASER DIODE DRIVER CIRCUIT

CROSS REFERENCE TO RELATED APPLICATIONS

This application is a continuation of PCT Application No. PCT/JP2020/045892, filed Dec. 9, 2020, which claims priority to Japanese Patent Application No. 2020-072989, filed Apr. 15, 2020, the entire contents of each of which are hereby incorporated by reference in their entirety.

TECHNICAL FIELD

The present disclosure relates to circuits for driving laser diodes, and more particularly, to a driver circuit for a laser diode configured to emit a short-pulsed laser beam.

BACKGROUND

FIG. 14 is a circuit diagram of a laser diode driver circuit disclosed in Japanese Unexamined Patent Application Publication No. 2009-544022 (hereinafter "Patent Document 1"). As shown in this laser diode driver circuit, a switching element 16 short-circuits a capacitor 15 charged with a high voltage via a laser diode 4. This configuration generates a light pulse, and the capacitor 15 is recharged via a charging element (e.g., a resistance element) 18. Moreover, a driver 17 actuates the switching element 16. A diode 19 has a function of discharging the charging current of the capacitor 15 and a function of providing an alternate path for the pulse current of the laser diode 4. The diode 19 suppresses oscillation of the current flowing through the circuit formed by the laser diode 4, the capacitor 15, and the switching element 16 and prevents a positive voltage applied via the laser diode 4. The resistance of a resistance element 20 is set to a value necessary for rapid dissipation of the pulse current of the laser diode 4.

FIG. 15 is a circuit diagram of a laser diode driver circuit disclosed in Japanese Unexamined Patent Application Publication No. 2016-152336 (hereinafter "Patent Document 2"). As shown, this laser diode driver circuit includes a series circuit 30, a diode 32, a switching element 34, and a control circuit 36. The series circuit 30 includes a direct current (DC) power source V1, an inductor 22, a reverse current blocking diode 24, a capacitor 26, and a laser diode 28 coupled in series with each other. The laser diode 28 emits light with the current from the capacitor 26. The diode 32 is coupled in parallel with the laser diode 28. The switching element 34, which has one end coupled between the diode 24 and the capacitor 26 and the other end grounded, controls the current flowing in the inductor 22 by turning on or off. Moreover, the control circuit 36 is provided to control the switching element 34 to be turned on or off. The control circuit 36 turns off the switching element 34 to charge the capacitor 26.

The laser diode driver circuit described in Patent Document 1 is assumed to be emitting a short-pulsed laser beam of about several to several tens of nanoseconds (ns). The switching element 16 needs about several to several tens of nanoseconds (ns) to change impedance. For this period, it cannot be said that the impedance of the switching element 16 is sufficiently low as compared to the impedance of the laser diode 4, and as a result, the voltage of the capacitor 15 is applied to both the laser diode 4 and the switching element 16, divided by the impedance of the laser diode 4 and the impedance of the switching element 16. Consequently, the voltage applied to the laser diode 4 is decreased, and the power of light emission from the laser diode 4 is weakened.

In general, the decrease in the power of light emission can be solved by increasing the input voltage ("high voltage" in FIG. 14). However, if an additional circuit is provided to generate this high voltage, the circuitry proportionally becomes more complex, and the increased components results in higher costs. Furthermore, the application of high voltage expands the pulse width of emitting light, which is problematic for the implementations that require short pulse width and high instantaneous peak.

With the laser diode driver circuit described in Patent Document 2, due to the same reason as the circuit presented in Patent Document 1, the voltage applied to the laser diode 4 and the power of light emission are decreased. This decrease in the power of light emission can be solved by increasing the voltage at a node Vo in FIG. 15. Furthermore, increasing the voltage at the node Vo expands the pulse width of emitting light, which is also problematic for the implementations that require short pulse width and high instantaneous peak.

SUMMARY OF THE INVENTION

In view of the foregoing limitations of existing designs, the exemplary embodiments of the present invention is to provide a driver circuit for a laser diode configured to emit a short-pulsed laser beam with short pulse width and high instantaneous peak.

In an exemplary aspect, a laser diode driver circuit is provided that has a loop including a laser diode, a drive capacitor configured to store drive charge, and a switch element, a first inductor coupled in series with the laser diode, a parallel capacitor coupled in parallel with a series circuit composed of the laser diode and the first inductor, and a first diode coupled in parallel with the series circuit in opposite polarity to the laser diode. In the laser diode driver circuit power supply terminals of a direct current (DC) power source are provided on both sides with respect to the switch element.

With this configuration, in addition to the current path formed by the drive capacitor, the switch element, the first inductor, and the laser diode, another current path is formed by the drive capacitor, the switch element, and the parallel capacitor. The first inductor is configured as an element of blocking the inrush current entering the laser diode immediately after the switch element is turned on. As a result, the current flowing in the laser diode immediately after the switch element is turned on is lower than without the parallel capacitor and the first inductor. Afterwards, the energy charged in the parallel capacitor is supplied to the laser diode. The current flowing in the laser diode is thus more than without the parallel capacitor.

Moreover, in an exemplary aspect, a laser diode driver circuit has a laser diode and a switch element that form a loop together with a DC power source, a first inductor coupled in series with the laser diode, and a parallel capacitor coupled in parallel with a series circuit composed of the laser diode and the first inductor.

With this configuration, in addition to the current path formed by the DC power source, the switch element, the first inductor, and the laser diode, another current path is formed by the DC power source, the switch element, and the parallel capacitor. The first inductor is configured as an element of blocking the inrush current entering the laser diode immediately after the switch element is turned on. As a result, the current flowing in the laser diode immediately after the switch element is turned on is less than without the parallel capacitor and the first inductor. Afterwards, the energy charged in the parallel capacitor is supplied to the laser diode. The current flowing in the laser diode is thus more than without the parallel capacitor.

Moreover, in an exemplary aspect, a laser diode driver circuit is provided that has a loop including a laser diode, a drive capacitor configured to store drive charge, and a switch element, a first inductor coupled in series with the laser diode, and a parallel capacitor coupled in parallel with a series circuit composed of the laser diode and the first inductor. In the laser diode driver circuit power supply terminals of a DC power source are provided on both sides with respect to the drive capacitor.

With this configuration, similarly to the exemplary configuration described above, immediately after the switch element is turned on, a relatively small amount of current flows into the laser diode, and afterwards, the current flowing in the laser diode increases.

The exemplary embodiments provide a laser diode driver circuit that enables emission of a short-pulsed laser beam with short pulse width and high instantaneous peak.

BRIEF DESCRIPTION OF DRAWINGS

FIG. 2 is a waveform diagram illustrating the current flowing in a laser diode LD1 after a switch element Q1 of the laser diode driver circuit 101 is turned on.

DETAILED DESCRIPTION OF EMBODIMENTS

Figure 1:
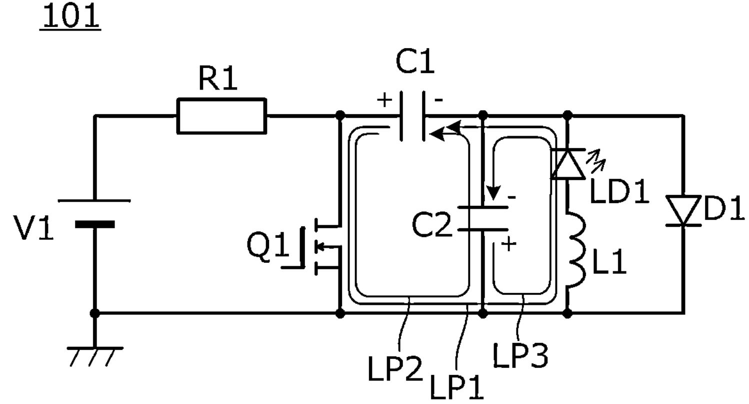
FIG. 1 is a circuit diagram of a laser diode driver circuit 101 according to a first exemplary embodiment.

The following provides descriptions of exemplary embodiments of the present disclosure by using specific examples with reference to the drawings. It is noted that like characters are used to denote like portions in the drawings. In consideration of simplicity of describing or understanding main points, for ease of description of the embodiments, the embodiments will be individually described; however, the configurations described in the different embodiments may be partially replaced or combined with each other as would be appreciated to one skilled in the art. In second and subsequent embodiments, descriptions about specifics common to the first embodiment are not repeated and only different points will be explained. In particular, the same effects and advantages achieved by the same configurations are not mentioned in every embodiment.

First Exemplary Embodiment

FIG. 1 is a circuit diagram of a laser diode driver circuit 101 according to a first exemplary embodiment. As shown, the laser diode driver circuit 101 has a first loop LP1 including a laser diode LD1, a drive capacitor C1 for storing drive charge, and a switch element Q1. A first inductor L1 is coupled in series with the laser diode LD1. Moreover, a parallel capacitor C2 is coupled in parallel with a series circuit composed of the laser diode LD1 and the first inductor L1. A first diode D1 is coupled in parallel with the series circuit composed of the laser diode LD1 and the first inductor L1 in opposite polarity to the laser diode LD1. On both sides with respect to the switch element Q1, power supply terminals of a direct current (DC) power source are provided and coupled thereto. A resistance element R1 is coupled in series with a DC power source V1. The switch element Q1, the drive capacitor C1, and the parallel capacitor C2 together form a second loop LP2. The parallel capacitor C2, the laser diode LD1, and the first inductor L1 together form a third loop LP3.

In operation, the switch element Q1 is turned off in a standby state. During this standby state, a current flows into the drive capacitor C1 through the path from the DC power source V1 to the resistance element R1, to the drive capacitor C1, and to the first diode D1, so that the drive capacitor C1 is charged with the direct-current voltage of the DC power source V1. During this standby state, a current flows into the parallel capacitor C2 through the path from the DC power source V1 to the resistance element R1, to the drive capacitor C1, and to the parallel capacitor C2. However, because the first diode D1 is coupled in parallel with the parallel capacitor C2, the parallel capacitor C2 is charged with only the voltage in the forward direction of the current flow first diode D1.

Moreover, to drive the laser diode LD1, the switch element Q1 is turned on, and the charge of the drive capacitor C1 is discharged through the path of the first loop LP1, thereby driving the laser diode LD1. The parallel capacitor C2 is charged by using the path of the second loop LP2.

Subsequently, the current discharged from the parallel capacitor C2 flows through the laser diode LD1 by following the path of the third loop LP3.

Afterwards, all the charge of the drive capacitor C1 is discharged, so that the current flowing in the laser diode LD1 becomes zero.

Figure 2:
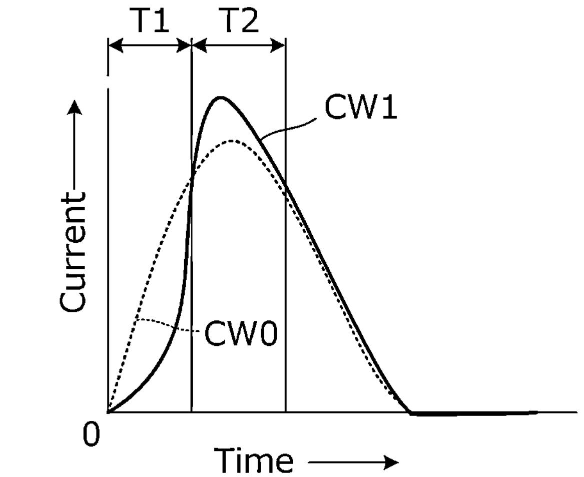

FIG. 2 is a waveform diagram illustrating the current flowing in the laser diode LD1 after the switch element Q1 of the laser diode driver circuit 101 is turned on. In FIG. 2, the horizontal axis indicates the time that elapses since the switch element Q1 has been turned on, and the vertical axis indicates the current flowing in the laser diode LD1. In FIG. 2, a waveform CW0 is a waveform of a laser diode driver circuit as a comparative example, and a waveform CW1 is a waveform of the laser diode driver circuit 101 according to the first exemplary embodiment described above. The laser diode driver circuit of the comparative example is configured without the first inductor L1 and the parallel capacitor C2.

As will be described below and for purposes of this disclosure, a time period T1 in FIG. 2 can be referred to as "drive current suppression period", whereas a time period T2 can be referred to as "drive current intensification period".

Because the present embodiment has, in addition to the current path including the drive capacitor C1, the switch element Q1, the first inductor L1, and the laser diode LD1 (i.e., the first loop LP1), the current path including the drive capacitor C1, the switch element Q1, and the parallel capacitor C2 (i.e., the second loop LP2), immediately after the switch element Q1 is turned on, the charge stored in the drive capacitor C1 is discharged by following the path of the first loop LP1 and also the second loop LP2. This operation suppresses the inrush current entering the laser diode LD1 during the time period T1 immediately after the switch element is turned on. The current flowing through the second loop LP2 charges the parallel capacitor C2.

Furthermore, immediately after the switch element Q1 is turned on, the first inductor L1 blocks with its inductance the inrush current entering the laser diode LD1. As such, also with the help of the first inductor L1, the inrush current entering the laser diode LD1 can be suppressed during the time period T1 immediately after the switch element is turned on.

During the time period T2, the energy charged in the parallel capacitor C2 is supplied to the laser diode LD1 through the path of the third loop LP3, and thus, the current flowing in the laser diode LD1 is more than without the parallel capacitor C2.

With the help of the parallel capacitor C2 and the first inductor L1 described above, the time period T2 as the drive current intensification period is shortened, and additionally, the peak of the drive current flowing in the laser diode LD1 is increased.

The current flowing in the circuit formed by the parallel capacitor C2, the first inductor L1, the laser diode LD1, and the first diode D1 is a damped oscillating current. When the peak of this current coincides with the peak of the current flowing from the drive capacitor C1 through the first loop LP1, the effect of current intensification during the time period T2 is maximized.

Thus, when the capacitance of the parallel capacitor C2 is represented by C2, the inductance of the first inductor L1 by L1, and the resistance component of the laser diode LD1 by $R_{LD1}$, it is preferable that the following condition be satisfied: $R^2_{LD1}<4L1/C2$. The same holds for the second and subsequent embodiments described later.

Figure 3:
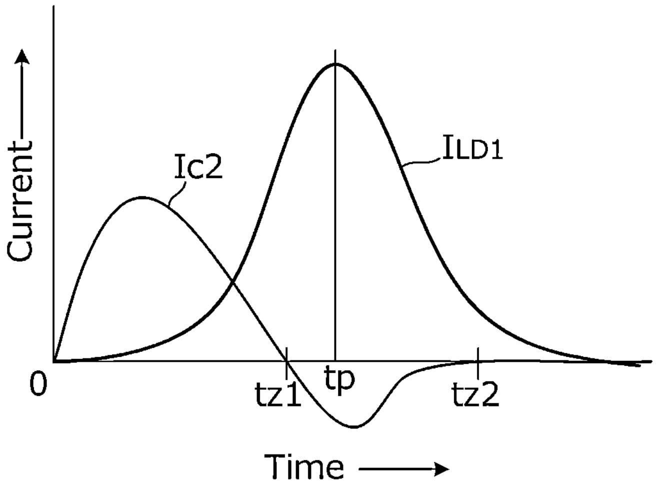
FIG. 3 illustrates an example of a waveform of a current $I_{LD1}$ flowing in the laser diode LD1 and an example of a waveform of a current $I_{c2}$ flowing in a parallel capacitor C2.

FIG. 3 illustrates an example of a waveform of the current $I_{LD1}$ flowing in the laser diode LD1 and an example of a waveform of the current $I_{c2}$ flowing in the parallel capacitor C2. Here, the direction of the current charging the parallel capacitor C2 by following the second loop LP2 illustrated in FIG. 1 is "positive", whereas the direction of the current discharged from the parallel capacitor C2 through the loop LP3 is "negative".

In FIG. 3, a time point tz1 indicates the time point at which the current $I_{c2}$ changes the direction from positive to negative; tp indicates the time point at which the current flowing in the laser diode LD1 reaches the maximum amount; and tz2 indicates the time point at which the current $I_{c2}$ changes the direction from negative to positive. As indicated in this example, the time point tp at which the current flowing in the laser diode LD1 preferably reaches the maximum amount in the period during which the current flows through the parallel capacitor C2 in the negative direction; in other words, it is preferable that the following condition is satisfied: $tz1<tp<tz2$. The relationship among tz1, tz2, and tp depends on the value of the parallel capacitor C2. However, when the above condition is satisfied, the current discharged from the parallel capacitor C2 intensifies the drive current of the laser diode LD1. The same holds for the second and subsequent embodiments described later.

Figure 4A:
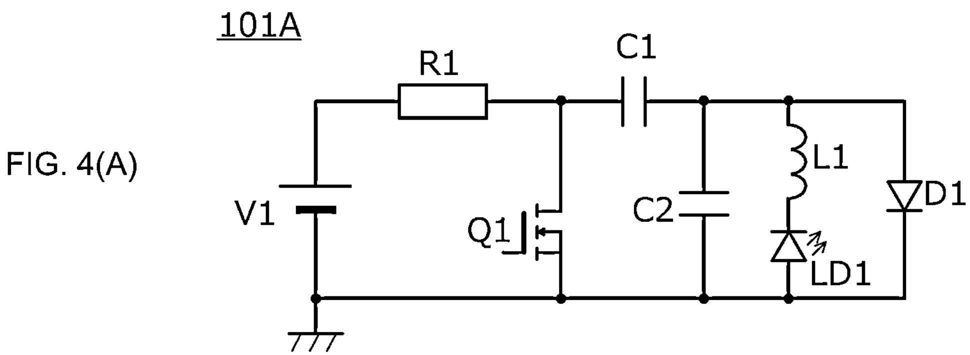
FIGS. 4(A), 4(B), and 4(C) provide circuit diagrams of other laser diode driver circuits according to the first exemplary embodiment.
Figure 4B:
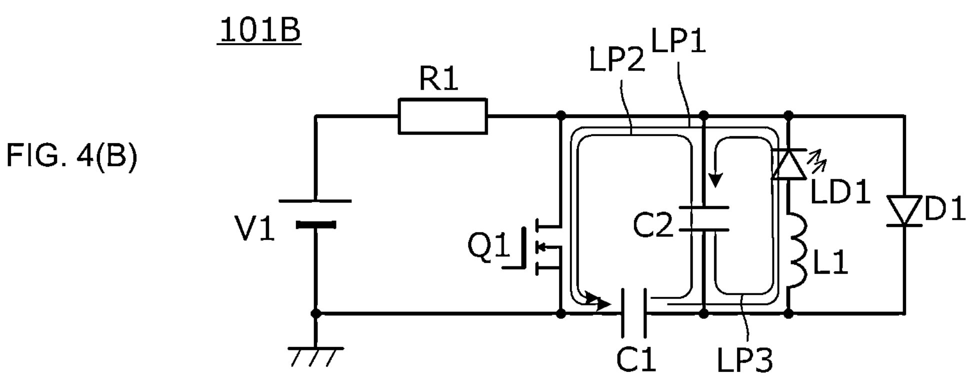
Figure 4C:
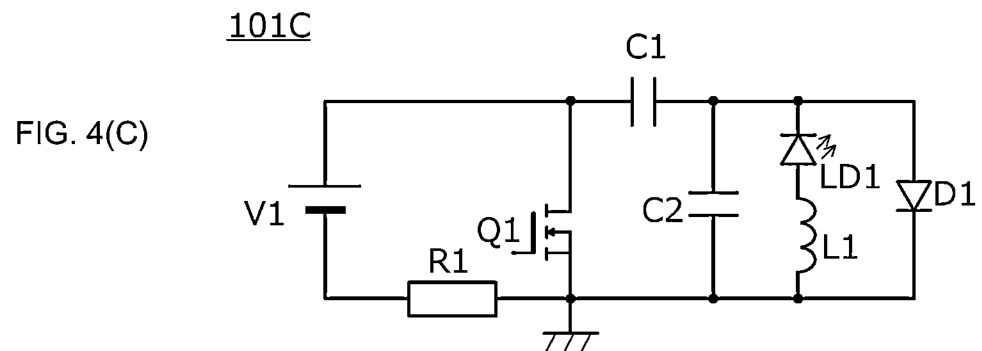

FIGS. 4(A), 4(B), and 4(C) illustrate circuit diagrams of other laser diode driver circuits according to the first exemplary embodiment.

In particular, a laser diode driver circuit 101A illustrated in FIG. 4(A) is an example formed by changing positions between the laser diode LD1 and the first inductor L1 illustrated in FIG. 1. As an electric circuit, the laser diode driver circuit 101A is equivalent to the laser diode driver circuit 101 illustrated in FIG. 1.

Moreover, a laser diode driver circuit 101B illustrated in FIG. 4(B) is an example formed by changing the position of the drive capacitor C1 illustrated in FIG. 1. The first loop LP1 and the second LP2 including the drive capacitor C1 is equivalent to the laser diode driver circuit 101, and thus, the laser diode driver circuit 101B is equivalent to the laser diode driver circuit 101 illustrated in FIG. 1 as an electric circuit.

Furthermore, a laser diode driver circuit 101C illustrated in FIG. 4(C) is an example formed by changing the position of the resistance element R1 illustrated in FIG. 1. The path of the current charging the drive capacitor C1 of the laser diode driver circuit 101C is equivalent to the path of the current charging the drive capacitor C1 of the laser diode driver circuit 101, and thus, the laser diode driver circuit 101C is equivalent to the laser diode driver circuit 101 illustrated in FIG. 1 as an electric circuit.

Second Exemplary Embodiment

A second exemplary embodiment describes as an example a laser diode driver circuit including a circuit for stepping up the voltage applied to charge the drive capacitor C1.

Figure 5:
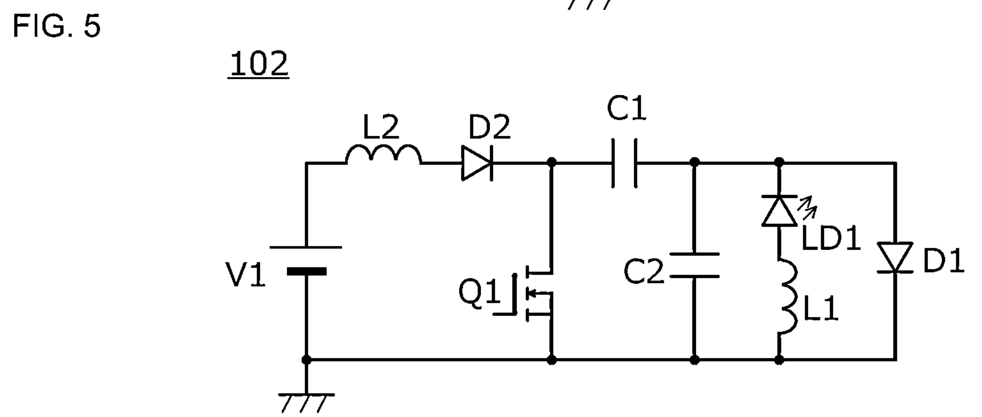
FIG. 5 is a circuit diagram of a laser diode driver circuit 102 according to a second exemplary embodiment.

FIG. 5 is a circuit diagram of a laser diode driver circuit 102 according to the second exemplary embodiment. As shown, the laser diode driver circuit 102 includes the laser diode LD1, the drive capacitor C1, the switch element Q1, the first inductor L1, the parallel capacitor C2, and the first diode D1. Moreover, a series circuit composed of a second inductor L2 and a second diode D2 is inserted between the DC power source V1 and the switch element Q1. This configuration of the series circuit composed of the second inductor L2 and the second diode D2 is different from the laser diode driver circuit 101 described in the first embodiment.

In operation of the laser diode driver circuit 102 according to the second embodiment, when the switch element Q1 is turned on, a current flows through the path from the DC power source V1 to the second inductor L2, to the second diode D2, and to the switch element Q1, and as a result, excitation energy is stored in the second inductor L2. Afterwards, when the switch element Q1 is turned off, a current flows through the path from the DC power source V1, to the second diode D2, to the drive capacitor C1, and to the first diode D1, thereby charging the drive capacitor C1. At this time, the drive capacitor C1 is charged with the voltage boosted by the same effect as a step-up chopper circuit.

The present embodiment can drive the laser diode LD1 with a voltage higher than the voltage of the DC power source V1. This configuration drives the laser diode LD1 with high voltage, without additionally using a dedicated booster circuit, by using fewer components.

Third Exemplary Embodiment

A third exemplary embodiment describes as an example a laser diode driver circuit that differs from the first and second embodiments in the configuration of the second loop LP2.

Figure 6:
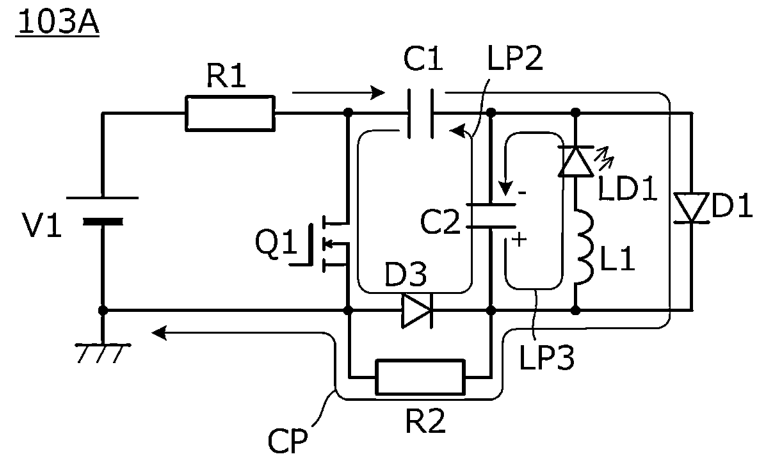
FIG. 6 is a circuit diagram of a laser diode driver circuit 103A according to a third exemplary embodiment.

In particular, FIG. 6 is a circuit diagram of a laser diode driver circuit 103A according to the third exemplary embodiment. As shown, the laser diode driver circuit 103A includes the laser diode LD1, the drive capacitor C1, the switch element Q1, the first inductor L1, the parallel capacitor C2, the first diode D1, and the resistance element R1.

Unlike the laser diode driver circuit 101 described in the first embodiment, the laser diode driver circuit 103A includes a parallel circuit composed of a resistance element R2 and a third diode D3 between the switch element Q1 and the parallel capacitor C2.

Parasitic inductance is present in the second loop LP2 including the switch element Q1, the drive capacitor C1, and the parallel capacitor C2. Due to the effect of this parasitic inductance, the voltage of the drive capacitor C1 may become higher than the voltage of the parallel capacitor C2. In this case, the third diode D3 prevents the current discharged from the parallel capacitor C2 from flowing toward the switch element Q1. As a result, as illustrated as the third loop LP3 in FIG. 6, a relatively larger amount of current flows into the laser diode LD1, and thus, a larger instantaneous peak current is achieved. In this configuration, the resistance element R2 forms a charging current path CP for the drive capacitor C1. To achieve the above described effect of the third diode D3, the resistance element R2 needs to be sufficiently higher than the impedance of the laser diode LD1.

Figure 7:
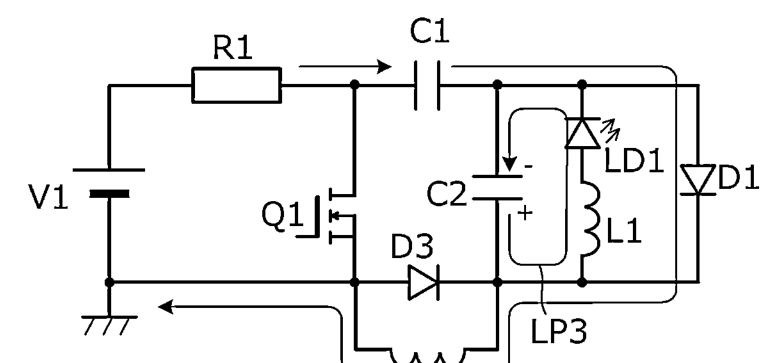
FIG. 7 is a circuit diagram of another laser diode driver circuit 103B according to the third exemplary embodiment.

FIG. 7 is a circuit diagram of another laser diode driver circuit 103B according to the third exemplary embodiment. The laser diode driver circuit 103B is depicted by the circuit diagram in which the resistance element R2 of the laser diode driver circuit 103A illustrated in FIG. 6 is replaced with a third inductor L3. With the configuration of the laser diode driver circuit 103B, the third diode D3 also prevents the current discharged from the parallel capacitor C2 from flowing toward the switch element Q1. The third inductor L3 also suppresses the transient current that is a current discharged from the parallel capacitor C2 and flows toward the switch element Q1, so that the above described effect of the third diode D3 is achieved.

Fourth Exemplary Embodiment

A fourth exemplary embodiment describes as an example a laser diode driver circuit that differs from the first, second, and third exemplary embodiments in the topology of circuit.

Figure 8:
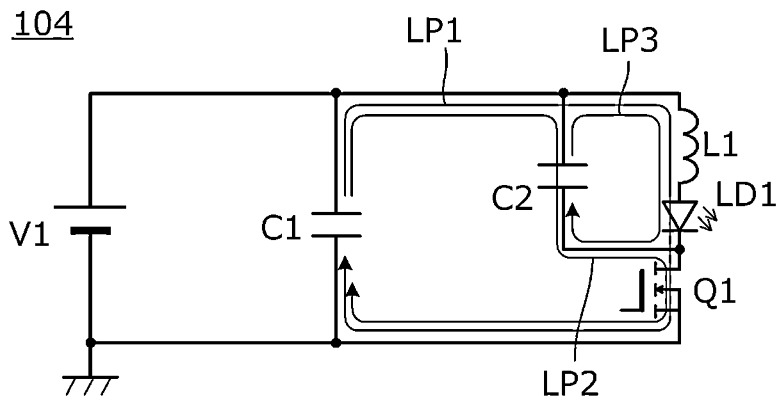
FIG. 8 is a circuit diagram of a laser diode driver circuit 104 according to a fourth exemplary embodiment.

In particular, FIG. 8 is a circuit diagram of a laser diode driver circuit 104 according to the fourth exemplary embodiment. As shown, the laser diode driver circuit 104 has the first loop LP1 including the laser diode LD1, the drive capacitor C1, and the switch element Q1, the first inductor L1 coupled in series with the laser diode LD1, and the parallel capacitor C2 coupled in parallel with the series circuit composed of the laser diode LD1 and the first inductor L1. In the laser diode driver circuit 104, power supply terminals of the DC power source are provided on both sides with respect to the drive capacitor C1.

In an exemplary aspect, the laser diode driver circuit 104 operates as follows.

In particular, the switch element Q1 is turned off in the standby mode. In the standby state, the voltage of the DC power source V1 is applied to the drive capacitor C1 to charge the drive capacitor C1.

To drive the laser diode LD1, the switch element Q1 is turned on, and the charge of the drive capacitor C1 is discharged through the path of the first loop LP1, thereby driving the laser diode LD1. Moreover, the parallel capacitor C2 is charged by using the path of the second loop LP2.

Subsequently, the current discharged from the parallel capacitor C2 flows through the laser diode LD1 by following the path of the third loop LP3.

Fifth Exemplary Embodiment

A fifth exemplary embodiment describes as an example a laser diode driver circuit formed by adding an element for blocking the current discharged from the parallel capacitor C2 to the laser diode driver circuit of the topology described in the fourth exemplary embodiment.

Figures 9, 10A, 10B:
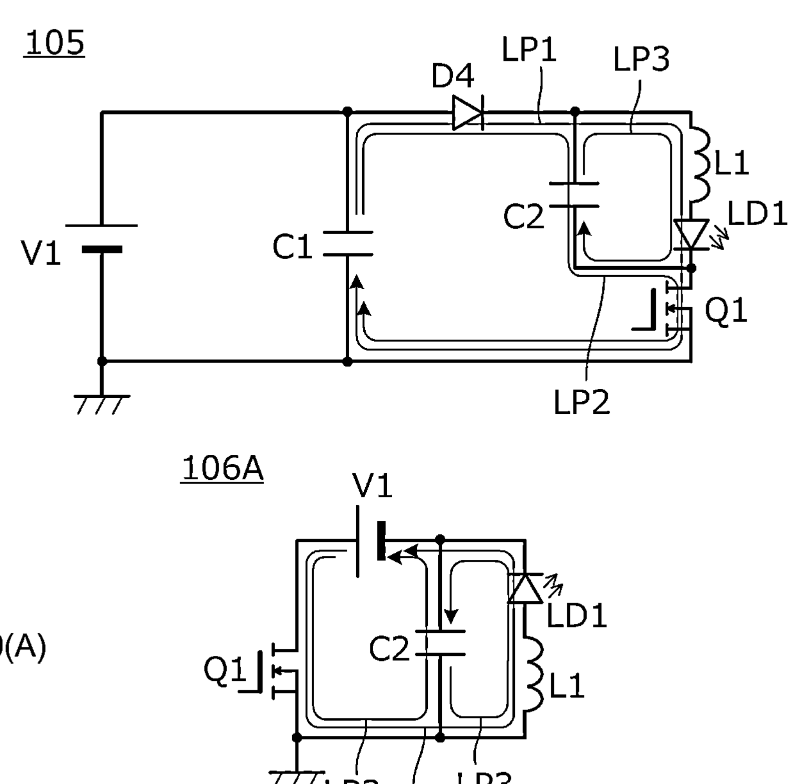
FIG. 9 is a circuit diagram of a laser diode driver circuit 105 according to a fifth exemplary embodiment.
FIGS. 10(A) and 10(B) provide circuit diagrams of a laser diode driver circuit 106A according to a sixth exemplary embodiment.

In particular, FIG. 9 is a circuit diagram of a laser diode driver circuit 105 according to the fifth exemplary embodiment. As shown, the laser diode driver circuit 105 includes a fourth diode D4 between the drive capacitor C1 and the parallel capacitor C2 of the laser diode driver circuit 104 illustrated in FIG. 8.

Parasitic inductance is present in the second loop LP2 including the switch element Q1, the drive capacitor C1, and the parallel capacitor C2. Due to the effect of this parasitic inductance, the voltage of the drive capacitor C1 may become higher than the voltage of the parallel capacitor C2. In this case, the fourth diode D4 is configured to prevent the current discharged from the parallel capacitor C2 from flowing toward the drive capacitor C1. As a result, all the current discharged from the parallel capacitor C2 flows into the laser diode LD1, and thus, a larger instantaneous peak current flows through the laser diode LD1.

Sixth Exemplary Embodiment

A sixth exemplary embodiment describes as an example a laser diode driver circuit that differs from the first, second, and third exemplary embodiments in the configuration of the drive capacitor C1 of the laser diode driver circuit.

In particular, FIGS. 10(A) and 10(B) provide circuit diagrams of a laser diode driver circuit 106A according to the sixth embodiment. FIG. 10(A) illustrates a circuit formed by replacing the drive capacitor C1 with the DC power source V1 and removing the first diode D1, based on the laser diode driver circuit 101 illustrated in FIG. 1. FIG. 10(B) illustrates the circuit illustrated in FIG. 10(A) in a general form.

According to an exemplary aspect, the laser diode driver circuit 106A operates as follows.

In operation, to drive the laser diode LD1, the switch element Q1 is turned on, and a drive current flows through the path from the DC power source V1 to the switch element Q1, to the first inductor L1, and to the laser diode LD1 (the first loop LP1). Additionally, a charging current flows through the path from the DC power source V1 to the switch element Q1 and to the parallel capacitor C2 (the second loop LP2) to charge the parallel capacitor C2. Subsequently, the current discharged from the parallel capacitor C2 flows through the path of the third loop LP3.

Afterwards, the switch element Q1 is turned off, so that the current flowing in the laser diode LD1 becomes zero.

Figure 11:
FIG. 11 is a circuit diagram of another laser diode driver circuit 106B according to the sixth exemplary embodiment.
Figure 11:
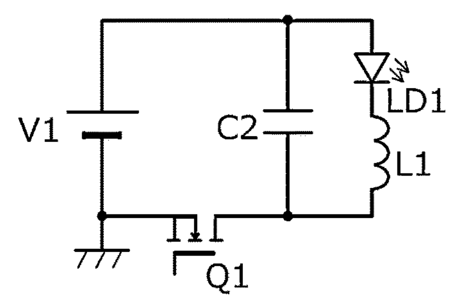

FIG. 11 is a circuit diagram of another laser diode driver circuit 106B according to the sixth exemplary embodiment. The DC power source of the laser diode driver circuit 106A described above is a negative power supply, whereas the laser diode driver circuit 106B exemplifies the case in which the DC power source is a positive power supply. The circuit operation of the laser diode driver circuit 106B is the same as the laser diode driver circuit 106A.

Seventh Exemplary Embodiment

A seventh exemplary embodiment describes as an example a laser diode driver circuit that differs from the fourth exemplary embodiment in the configuration of the drive capacitor C1 of the laser diode driver circuit.

Figure 12:
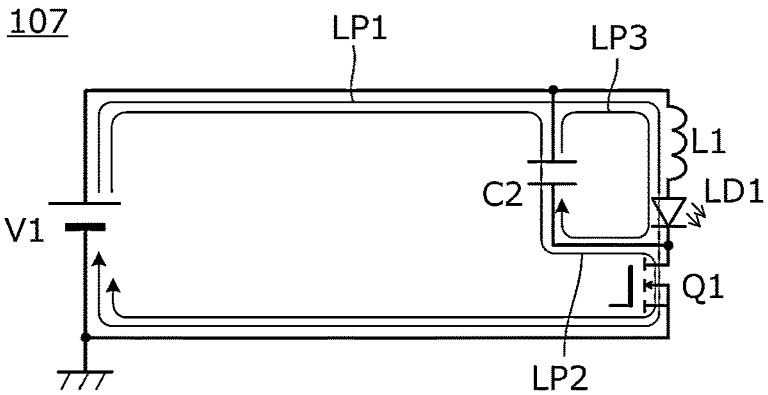
FIG. 12 is a circuit diagram of a laser diode driver circuit 107 according to a seventh exemplary embodiment.

In particular, FIG. 12 is a circuit diagram of a laser diode driver circuit 107 according to the seventh exemplary embodiment. The laser diode driver circuit 107 is formed by replacing the drive capacitor C1 with the DC power source V1 in the laser diode driver circuit 104 illustrated in FIG. 8.

In an exemplary aspect, the laser diode driver circuit 107 operates as follows.

To drive the laser diode LD1, the switch element Q1 is turned on, and a drive current flows through the path from the DC power source V1 to the first inductor L1, to the laser diode LD1, and to the switch element Q1 (the first loop LP1). Additionally, a charging current flows through the path from the DC power source V1 to the parallel capacitor C2 and to the switch element Q1 (the second loop LP2) to charge the parallel capacitor C2. Subsequently, the current discharged from the parallel capacitor C2 flows through the path of the third loop LP3.

Afterwards, the switch element Q1 is turned off, so that the current flowing in the laser diode LD1 becomes zero.

Eighth Exemplary Embodiment

An eighth exemplary embodiment describes as an example a laser diode driver circuit that differs from the fifth exemplary embodiment in the configuration of the drive capacitor C1 of the laser diode driver circuit.

Figure 13:
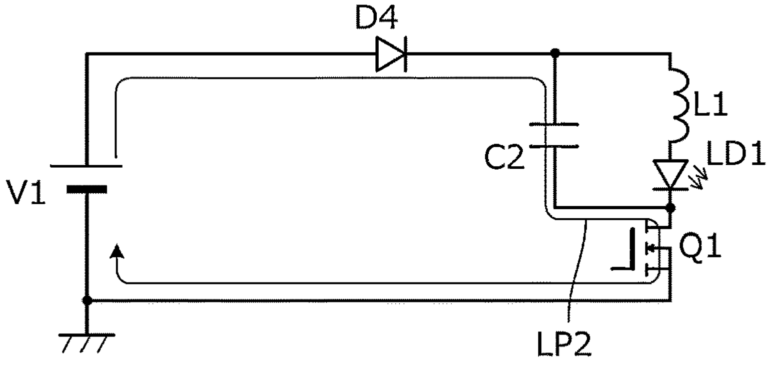
FIG. 13 is a circuit diagram of a laser diode driver circuit 108 according to an eighth exemplary embodiment.
Figure 14:
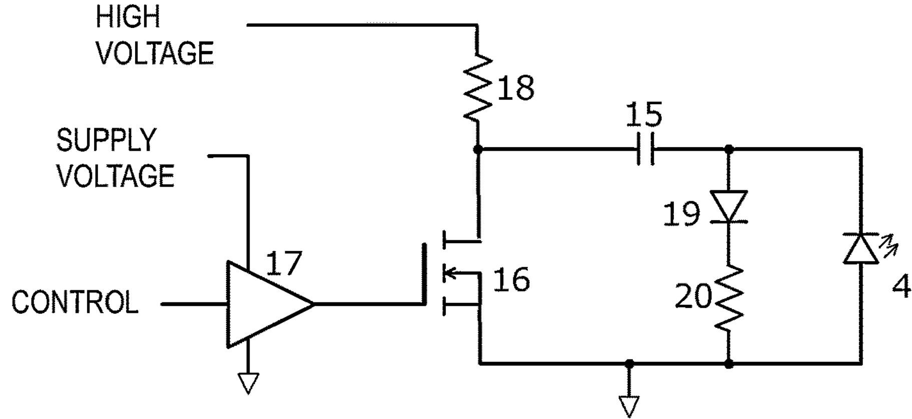
FIG. 14 is a circuit diagram of a laser diode driver circuit disclosed in Patent Document 1.
Figure 15:
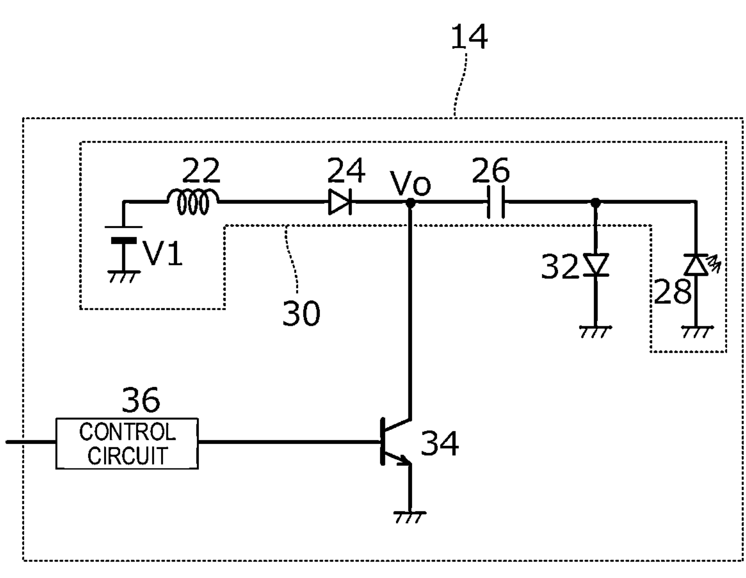
FIG. 15 is a circuit diagram of a laser diode driver circuit disclosed in Patent Document 2.

In particular, FIG. 13 is a circuit diagram of a laser diode driver circuit 108 according to the eighth exemplary embodiment. As shown, the laser diode driver circuit 108 is formed by replacing the drive capacitor C1 with the DC power source V1 in the laser diode driver circuit 105 illustrated in FIG. 9.

According to an exemplary aspect, the laser diode driver circuit 108 operates as follows.

To drive the laser diode LD1, the switch element Q1 is turned on, and a drive current flows through the path from the DC power source V1 to the fourth diode D4, to the first inductor L1, to the laser diode LD1, and to the switch element Q1. Additionally, a charging current flows through the path from the DC power source V1 to the fourth diode D4, to the parallel capacitor C2, and to the switch element Q1 to charge the parallel capacitor C2. Subsequently, the current discharged from the parallel capacitor C2 flows into the laser diode LD1.

Afterwards, the switch element Q1 is turned off, so that the current flowing in the laser diode LD1 becomes zero.

Parasitic inductance is present in the second loop LP2 including the switch element Q1, the drive capacitor C1, and the parallel capacitor C2. Due to the effect of this parasitic inductance, the voltage of the drive capacitor C1 may become higher than the voltage of the parallel capacitor C2. In this case, the fourth diode D4 prevents the current discharged from the parallel capacitor C2 from flowing toward the DC power source V1.

Finally, it is noted that the present disclosure is not limited to the embodiments described above. Those skilled in the art can make modifications and changes as appropriate to the exemplary embodiments.

For example, the first inductor L1 described in the exemplary embodiments can be provided by the parasitic inductance of interconnections about the laser diode LD1. Alternatively, the combined inductance of an inductor and a parasitic inductance can be used as the first inductor L1.

Moreover, the parallel capacitor C2 described in the exemplary embodiments can be provided by the parasitic capacitance of interconnections about the laser diode LD1. Alternatively, the combined capacitance of a capacitor and a parasitic capacitance can be used as the parallel capacitor C2.

REFERENCE SIGNS LIST

C1 drive capacitor
C2 parallel capacitor
CP charging current path
D1 first diode
D2 second diode
D3 third diode
D4 fourth diode
L1 first inductor
L2 second inductor
L3 third inductor
LD1 laser diode
LP1 first loop
LP2 second loop
LP3 third loop
Q1 switch element
R1, R2 resistance element
V1 DC power source
101, 101A, 101B, 101C, 102, 103A, 103B, 104, 105, 106A, 106B, 107, 108 laser diode driver circuit

The invention claimed is:

1. A laser diode driver circuit comprising:

a loop including a laser diode, a drive capacitor configured to store a drive charge, and a switch element;

a first inductor coupled in series with the laser diode;

a parallel capacitor coupled in parallel with a series circuit that includes the laser diode and the first inductor; and a first diode coupled in parallel with the series circuit and in opposite polarity to the laser diode, wherein a pair of power supply terminals of a direct current (DC) power source are coupled to respective sides of the switch element, and $$R^2_{LD1} < 4L1/C2,$$

where C2 is a capacitance of the parallel capacitor, L1 is an inductance of the first inductor, and $R_{LD1}$ is a resistance component of the laser diode.

2. The laser diode driver circuit according to claim 1, further comprising a series circuit that includes a second inductor and a second diode and that is disposed between one of the pair of power supply terminals of the DC power source and one of the respective sides of the switch element.

3. The laser diode driver circuit according to claim 1, further comprising a parallel circuit that is disposed between the switch element and the parallel capacitor and that includes a third diode configured to block reverse current and at least one of a resistance element and an additional inductor.

4. The laser diode driver circuit according to claim 1, wherein a current flowing in a circuit formed by the parallel capacitor, the first inductor, and the laser diode is a damped oscillating current, and a peak of the damped oscillating current coincides with a peak of a current flowing through a loop that includes the laser diode and the switch element.

5. The laser diode driver circuit according to claim 1, wherein, when Tz1 is a time point at which a direction of a current flowing in the parallel capacitor changes from a forward direction to a reverse direction, Tz2 is a time point at which the direction of the current flowing in the parallel capacitor changes from the reverse direction to the forward direction, and Tp is a time point at which a current flowing in the laser diode reaches a peak, a capacitance of the parallel capacitor is set to satisfy $Tz1<Tp<Tz2$.

6. The laser diode driver circuit according to claim 1, wherein the first inductor is provided by a parasitic inductance of an interconnection about the laser diode.

7. The laser diode driver circuit according to claim 1, wherein the parallel capacitor is provided by a parasitic capacitance of an interconnection about the laser diode.

8. The laser diode driver circuit according to claim 1, further comprising a resistance element disposed between one of the pair of power supply terminals of the DC power source and one of the respective sides of the switch element.

* * * * *